(12) United States Patent
Marchman et al.

(10) Patent No.: US 8,054,558 B2
(45) Date of Patent: Nov. 8, 2011

(54) MULTIPLE MAGNIFICATION OPTICAL SYSTEM WITH SINGLE OBJECTIVE LENS

(75) Inventors: Herschel M. Marchman, Dallas, TX (US); Gonzalo Amador, Dallas, TX (US)

(73) Assignee: Omniprobe, Inc., Dallas, TX (US)

( * ) Notice: Subject to any disclaimer, the term of this patent is extended or adjusted under 35 U.S.C. 154(b) by 0 days.

(21) Appl. No.: 12/701,071

(22) Filed: Feb. 5, 2010

(65) Prior Publication Data

US 2010/0202042 A1 Aug. 12, 2010

Related U.S. Application Data

(60) Provisional application No. 61/151,687, filed on Feb. 11, 2009.

(51) Int. Cl.
*G02B 21/02* (2006.01)
*G02B 3/00* (2006.01)
*G02B 9/00* (2006.01)

(52) U.S. Cl. .......................... 359/656; 359/652; 359/661

(58) Field of Classification Search .................. 359/652, 359/653, 656–661
See application file for complete search history.

(56) References Cited

U.S. PATENT DOCUMENTS

| | | |
|---|---|---|
| 3,877,779 A | 4/1975 | Pierse |
| 4,300,812 A | 11/1981 | Nakahashi |
| 4,385,810 A | 5/1983 | Hamou |
| 4,664,486 A | 5/1987 | Landre et al. |
| 4,993,818 A | 2/1991 | Cook |
| 5,002,376 A | 3/1991 | Hoppl et al. |
| 5,113,281 A | 5/1992 | Mandelboum et al. |
| 5,161,051 A | 11/1992 | Whitney et al. |
| RE34,622 E | 5/1994 | Ledley |
| 5,365,341 A | 11/1994 | Sugawara |
| 5,386,316 A | 1/1995 | Cook |
| 5,418,645 A | 5/1995 | Coath et al. |
| 6,530,882 B1 | 3/2003 | Farkas et al. |

(Continued)

OTHER PUBLICATIONS

Konstantin Sokolov, Kung-Bin Sung, Tom Collier, Anne Clark, Dizem Arifler, Alicia Lacy, Michael Descour and Rebecca Richards-Kortum, Endoscopic microscopy, Disease Markers 18 (2002) 269-291, IOS Press.

(Continued)

*Primary Examiner* — Alicia M Harrington
(74) *Attorney, Agent, or Firm* — John A. Thomas

(57) ABSTRACT

A multiple magnification optical system has a single objective focused upon a specimen at a given working distance. A graded-index lens receives light passing through the objective from the specimen. A beam splitter splits the light exiting the gradient-index lens into a first optical axis and a second optical axis. A first lens is aligned in the first optical axis between the beam splitter and a first camera to focus a magnified image at the first camera. A second camera is situated along the second optical axis from the rear principal plane of the objective so as to obtain unity magnification when the working distance of the objective is set at twice its focal length. Multiple magnifications can be obtained with a single objective by moving the optical system axially to set different working distances from a specimen, and by using multiple beam splitters, or combinations thereof.

12 Claims, 4 Drawing Sheets

U.S. PATENT DOCUMENTS

| | | | |
|---|---|---|---|
| 6,643,071 B2 * | 11/2003 | Schnitzer | 359/653 |
| 6,816,304 B2 | 11/2004 | Nakamura et al. | |
| 7,038,846 B2 | 5/2006 | Mandella | |
| 7,099,077 B2 | 8/2006 | Cook | |
| 7,351,966 B1 | 4/2008 | Marchman et al. | |
| 7,551,219 B2 | 6/2009 | Monroe | |
| 7,593,156 B2 | 9/2009 | Sander | |
| 7,633,041 B2 | 12/2009 | Furman et al. | |
| 2003/0086083 A1 | 5/2003 | Ebert et al. | |
| 2009/0147378 A1 | 6/2009 | Zalevsky et al. | |

OTHER PUBLICATIONS

F. J. W-M. Leong and J. O'D. McGee, Automated complete slide digitization: a medium for simultaneous viewing by multiple pathologists, Journal of Pathology, 2001; 195: 508-514, John Wiley & Sons, Ltd.

Richard Gaughan, Single-Lens System Offers Simultaneous Fields of View, PhotonicsSpectra, Feb. 2006.

* cited by examiner

MULTIPLE MAGNIFICATION OPTICAL SYSTEM WITH SINGLE OBJECTIVE LENS

CLAIM FOR PRIORITY

This application claims the priority of U.S. Provisional Application Ser. No. 61/151,687, filed Feb. 11, 2009, which provisional application is incorporated by reference into the present application.

CROSS REFERENCE RELATED APPLICATIONS

This application is related to U.S. patent application Ser. No. 12/201,447, filed Aug. 29, 2008, titled "Single-channel optical processing system for energetic-beam microscopes."

BACKGROUND

1. Technical Field

This disclosure is related to microscopes adapted for use in charged-particle instruments, where the microscope provides multiple magnifications with a single objective lens.

2. Background

It is often desirable to optically monitor the processing of a sample inside the closed space of a charged-particle beam apparatus, such as a focused ion-beam microscope or scanning-electron microscope, or any other vacuum chamber lacking the capability to render an image with high magnification. The distance from the vacuum chamber wall to the sample imaging location, the limited space between the sample and the charged-particle beam pole piece, the limited number of ports available in the charged-particle beam apparatus and the necessity to keep the vacuum pressure unchanged make it difficult to find a reliable and simple solution to this problem.

In this disclosure, we solve these problems using a single-objective lens combined with a gradient index lens (also called a self-focusing rod lens) to provide images of a specimen with different magnifications to two or more cameras or imaging devices. We also disclose systems adaptable to existing nanomanipulators, so that the working distance from the specimen to the objective can be easily varied as the nanomanipulator moves the system toward or away from the specimen. Such a system would also preferably be integrated with light sources for illumination of the specimen The light delivered inside the vacuum chamber can be of any wavelength from the optical region of deep UV (starting from 190 nm) to far IR (up to 10 microns).

DRAWINGS

DESCRIPTION

In this disclosure, the term "objective lens" should be understood to include simple lenses, as well as achromatic or other corrected lenses, and lenses having one or two principal planes. Suitable gradient-index lenses are manufactured by NGS America, Inc. of Somerset, N.J. and sold under the trademark SELFOC. The term "camera" refers to any sort of camera or imaging device, such as a charge-coupled device, or CCD. The "working distance" an objective lens is the distance from a specimen of interest to the first principal plane of the objective lens, or the one principal plane if there is only one.

Figure 1:
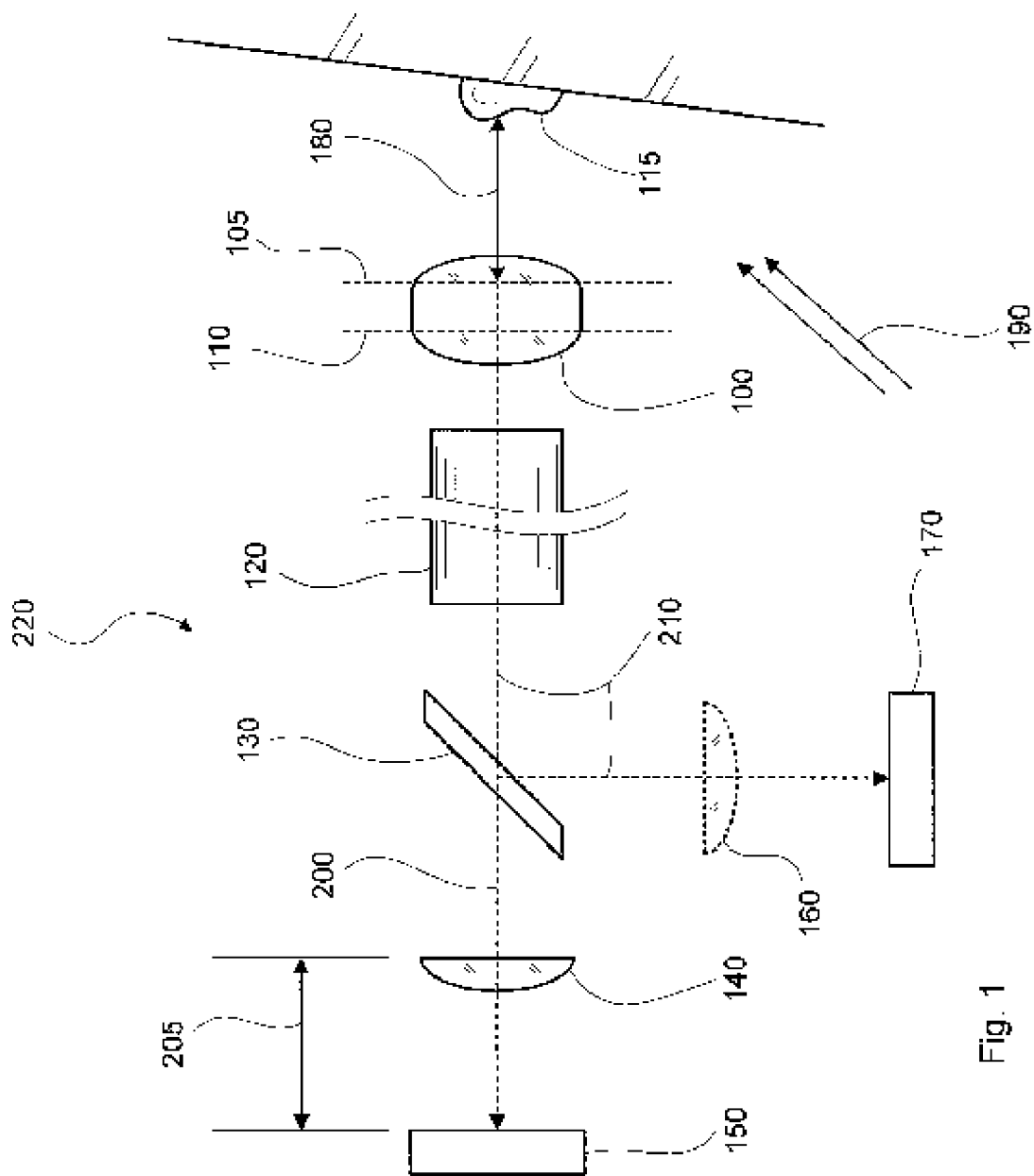
FIG. 1 is a schematic diagram of the optical system of this disclosure.

FIG. 1 shows an embodiment of a multiple magnification optical system (220) for viewing a specimen (115). A single objective lens (100) is focused upon a specimen (115) at a working distance (180) as indicated. The objective lens (100) has a focal length F0. In FIG. 1, the objective (100) is shown as having a first principal plane (105) and a second principal plane (110). Some objective lenses (100) of course will have only one principal plane. A graded-index lens (120) is positioned to receive light passing through the objective lens (100) from the specimen (115). The gradient-index lens (120) thus preserves the phase of the light entering from the objective (100). The specimen may be illuminated with light (190) as discussed below.

FIG. 1 further shows a beam splitter (130) or other optical path switching device positioned to receive light passing through the gradient-index lens (120). The beam splitter splits the light exiting the gradient-index lens (120) into a first optical axis (200) and a second optical axis (210). There is a first lens (130) aligned in the first optical axis (200) between the beam splitter (130) and a first camera (150). The first lens (140) has a focal length of F1 and is located at the distance F1 (205) from the first camera (150). The first lens (140) thus focuses a real image of the specimen (115) at the first camera (150), at a magnification equal to F1/F0.

FIG. 1 further shows a second camera (170). The second camera (170) is situated along the second optical axis (210) a distance equal to 2F0 from the rear principal plane (110) of the objective lens (100). The magnification of the specimen (115) at the second camera (170) is thus unity when the working distance (180) of the objective lens (100) is set at 2F0.

In an alternative embodiment, a second lens (160) may be inserted in the second optical axis (210) between the beam splitter (130) and the second camera to relay an image with a magnification equal to less than unity, when the working distance of the objective lens (100) is greater than 2F0.

Given that the spacing relationships between the optical elements in the optical system (220) are preferably fixed, the first and second magnifications are obtained by moving the working distance (180) of the objective lens (100) from a specimen (115). In the usual application inside a vacuum instrument, this is easily done by moving the system (220) with a nanomanipulator probe, as next illustrated.

Figure 2:
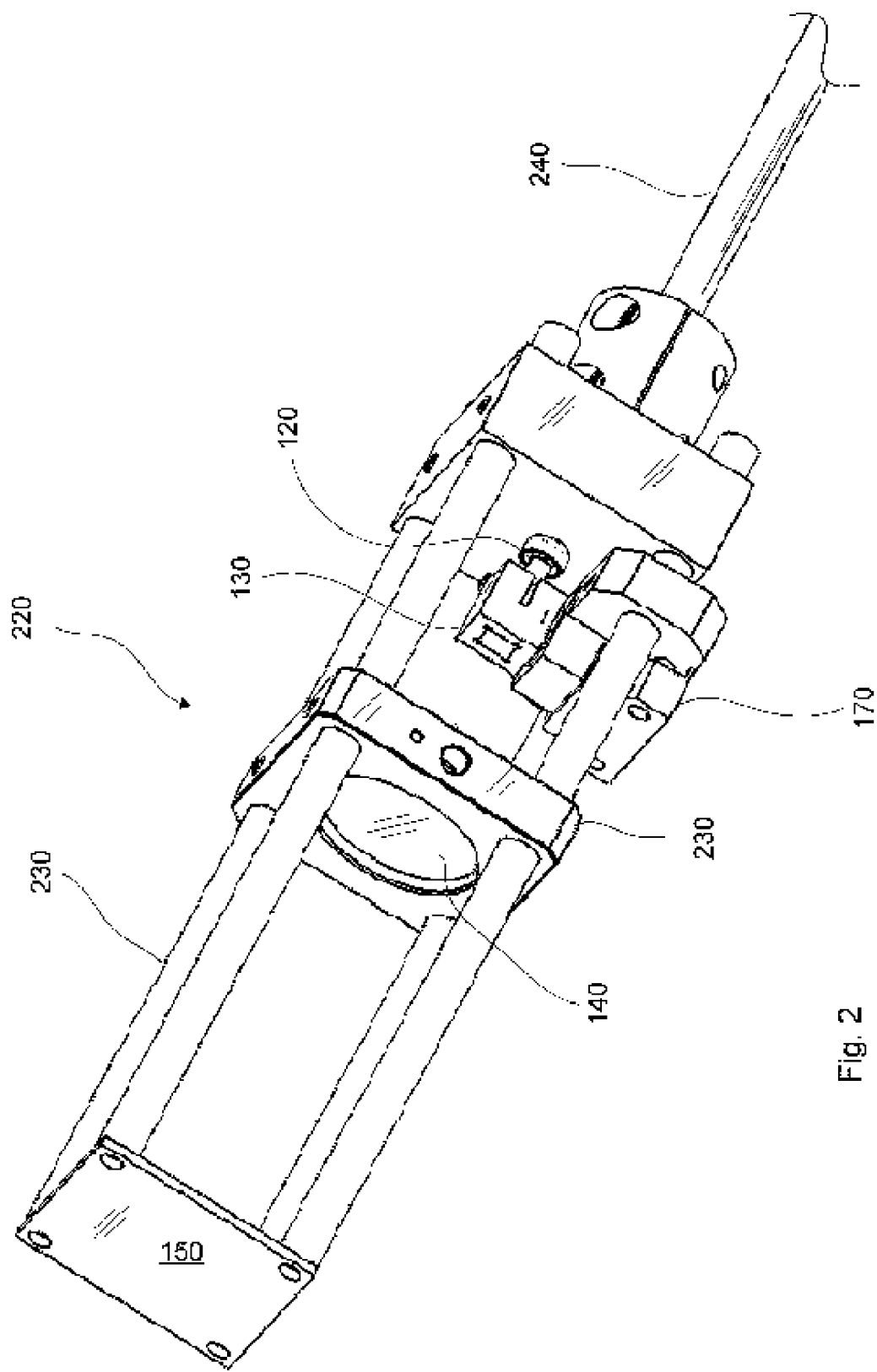
FIG. 2 is a perspective view of a hardware embodiment of the optical system illustrated in FIG. 1, but omitting the location of the objective lens and the full extension of the gradient-index lens.
Figure 3:
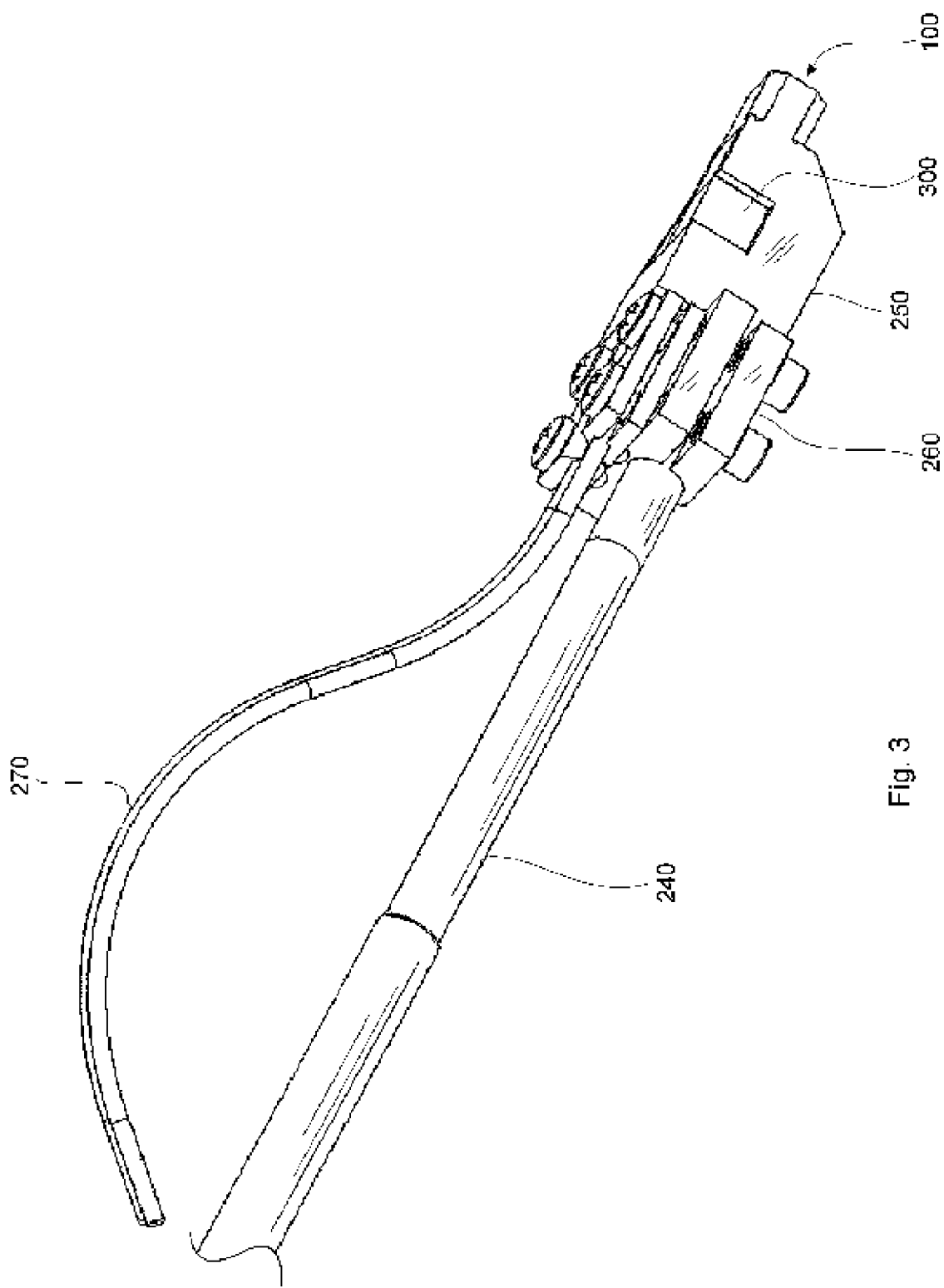
FIG. 3 is a perspective view of a hardware embodiment of the optical system illustrated in FIG. 1, but showing the end of the gradient-index lens located adjacent to the objective lens.
Figure 4:
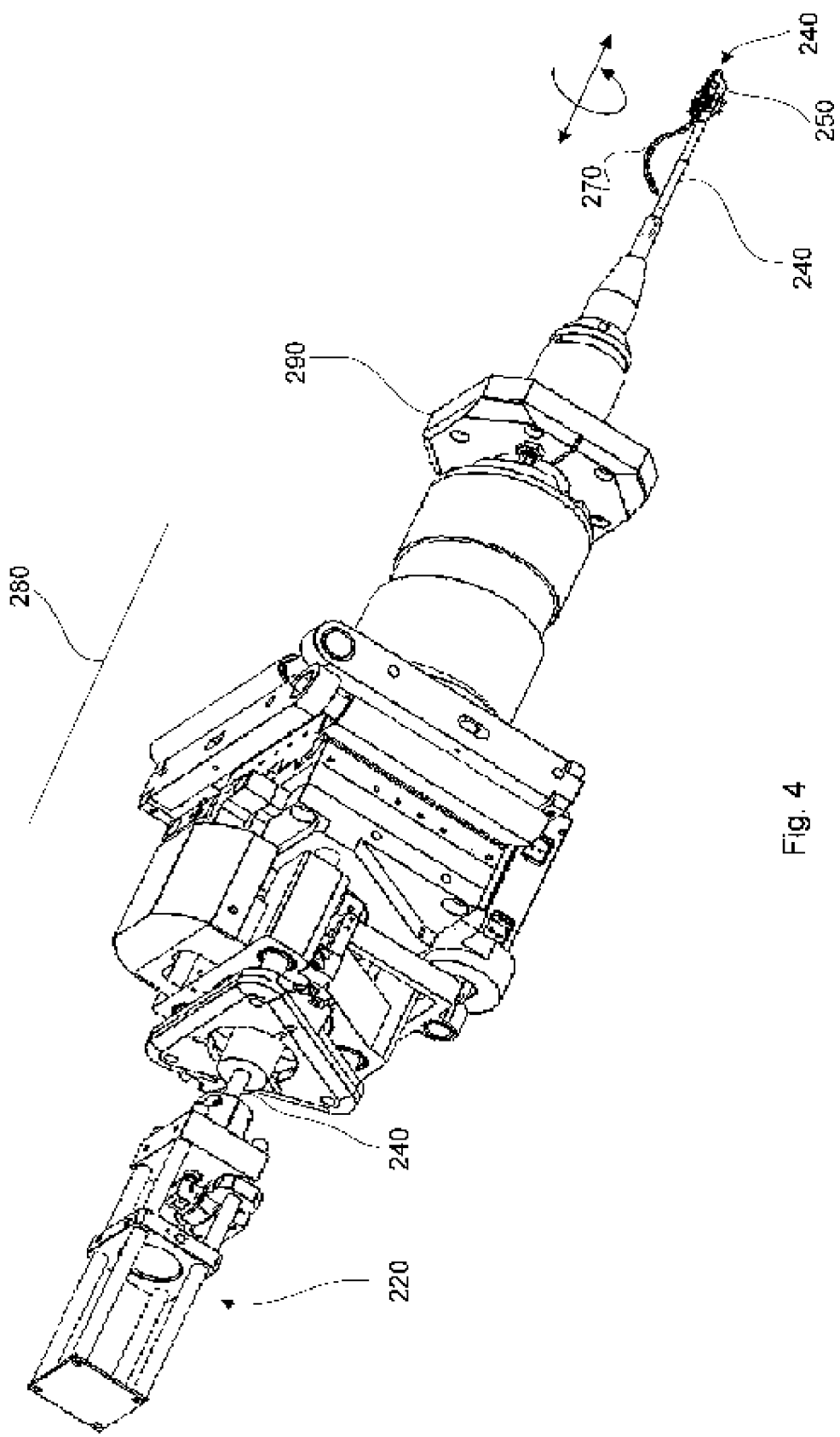
FIG. 4 is a perspective view of a hardware embodiment of the optical system showing the entire system positioned in a nanomanipulator for attachment to a vacuum instrument.

FIG. 2 is a perspective view of a hardware embodiment of the optical system illustrated in FIG. 1, but omitting the location of the objective lens (100) and the full extension of the gradient-index lens (120). FIG. 3 is a perspective view of the same hardware embodiment of the optical system (220), but showing the end of the gradient-index lens (120) located adjacent to the objective lens (100). FIG. 4 shows the complete embodiment as it would be held by a nanomanipulator (280), such as the Autoprobe 300, manufactured by Omniprobe, Inc. of Dallas, Tex.

In the hardware embodiment, the gradient-index lens (120) is clasped in a sleeve (240), which sleeve (240) is sized to be gripped and moved axially by the nanomanipulator system (280). FIG. 2 shows the location of the beam splitter (130) in the optical axis of the gradient-index lens (120), the first lens (140) and the first camera (150) and second camera (170). The optical components are preferable held in a frame (230) assembled with screws, although frames (230) assembled with welding, crimping or gluing would be possible.

FIG. 3 shows the details for the mounting of the objective lens (100) in the same hardware embodiment. The objective lens (100) is held in a second frame (250) that is preferably held to the sleeve (240) of the gradient-index lens (120) with a clamp (260), although other mechanical mounting methods could be used. The second frame (250) also receives fiber optics (270) for illumination (190) of the specimen (115), if desired.

FIG. 4 shows a complete hardware embodiment of the system (220) mounted in a nanomanipulator system (280). The sleeve (240) covering the gradient-index lens (120) extends through the nanomanipulator system (280), so that the exit end of the gradient-index lens (120) and other components in the optical train are held outside the vacuum chamber of the vacuum instrument (not shown), while the objective lens and the entrance end of the gradient-index lens (120) and the objective lens (100) are held inside the vacuum chamber. Typically the nanomanipulator system (280) is fastened to a port on the vacuum system of the instrument at a flange (290), as shown in FIG. 4. The nanomanipulator system (280) can thus move the entire optical system (220) axially to place the objective lens (100) at the desired working distance (180) from the specimen (115).

The reader should understand that the optical system (220) can have more than one beam splitter (130), so as to create multiple optical axes and thus multiple images of the same area with different magnifications, or with different spectral filters. For example, the first image obtained could be used to show a small part of the specimen (115) with high magnification, and the second and next order images could be used to show wider coverage of the area of interest on the specimen (115). The amount of light reflected and transmitted through each beam splitter (130) could be set at the most convenient ratio, such as 70/30, instead of 50/50. Also, a dichroic mirror could be used in place of a conventional beam splitter, for example, where a bright field image is used to investigate the fluorescence of different parts of the specimen (115) in different spectral bands. A colored region in a biological sample, for example, could be examined with the optical system (220), and then this region could be imaged at higher magnification with an electron beam. The system (220) is not restricted to vacuum environments; it could also be used in variable pressure microscopes, such as the environmental scanning-electron microscope, or in the open air for areas not accessible by ordinary means.

None of the description in this application should be read as implying that any particular element, step, or function is an essential element which must be included in the claim scope; the scope of patented subject matter is defined only by the allowed claims. Moreover, none of these claims are intended to invoke paragraph six of 35 U.S.C. Section 112 unless the exact words "means for" are used, followed by a gerund. The claims as filed are intended to be as comprehensive as possible, and no subject matter is intentionally relinquished, dedicated, or abandoned.

We claim:

1. A multiple magnification optical system for viewing a specimen, comprising:
   a single objective lens;
      the objective lens having a focal length equal to F0;
      the objective lens having a principal plane;
      the objective lens located inside the vacuum chamber of an instrument;
   a gradient-index lens;
      the gradient-index lens positioned to receive light passing through the objective lens;
      the gradient-index lens having first and second ends;
   a beam splitter;
      the beam splitter creating first and second optical axes;
      the beam splitter located outside the vacuum chamber and positioned to receive light passing through the gradient-index lens;
   the first end of the gradient-index lens located inside the vacuum chamber adjacent to the objective lens;
   the second end of the gradient-index lens located outside the vacuum chamber adjacent to the beam splitter;
   a first camera aligned in the first optical axis;
   a first lens in the first optical axis;
      the first lens having a focal length equal to F1;
      the first lens situated a distance F1 from the first camera;
   a second camera aligned in the second optical axis;
      the second camera situated a distance from the principal plane of the objective lens equal to 2F0;
   so that a first magnification of the specimen at the first camera is obtained where the working distance of the objective lens from a specimen is equal to F0, and a second magnification of the specimen at the second camera is obtained where the working distance of the objective lens from the specimen is equal to 2F0.

2. The multiple magnification optical system of claim 1, where the principal plane is the rear principal plane of the objective lens, where the objective lens has front and rear principal planes.

3. The multiple magnification system of claim 1, further comprising:
   a first frame;
      the first frame holding the beam splitter, the first lens, the first camera, the second lens and the second camera in optical alignment with the gradient-index lens;
   a sleeve; and,
      the sleeve covering the length of the gradient-index lens;
      the sleeve connected to the first frame;
      the sleeve having a diameter adapted to be gripped by a nanomanipulator system.

4. The multiple magnification system of claim 3, further comprising:
   a second frame;
      the second frame holding the objective lens;
      the second frame connected to the sleeve for the gradient-index lens, so that the gradient-index lens is held in optical alignment with the objective lens.

5. The multiple magnification system of claim 4, further comprising:
   one or more fiber optics for transmitting light to illuminate the specimen;
   the one or more fiber optics held by the second frame.

6. The multiple magnification system of claim 1, where the beam splitter is a dichroic mirror.

7. A multiple magnification optical system for viewing a specimen, comprising:
   a single objective lens;
      the objective lens having a focal length equal to F0;
      the objective lens having a principal plane;
      the objective lens located inside the vacuum chamber of an instrument;
   a gradient-index lens;
      the gradient-index lens positioned to receive light passing through the objective lens;
      the graded-index lens having first and second ends;
   a beam splitter;

the beam splitter creating first and second optical axes;
the beam splitter located outside the vacuum chamber and positioned to receive light passing through the gradient-index lens;
the first end of the gradient-index lens located inside the vacuum chamber adjacent to the objective lens;
the second end of the gradient-index lens located outside the vacuum chamber adjacent to the beam splitter;
a first camera aligned in the first optical axis;
a first lens in the first optical axis;
the first lens having a focal length equal to F1;
the first lens situated a distance F1 from the first camera;
a second camera aligned in the second optical axis;
the second camera situated a distance from the principal plane of the objective lens greater than 2F0;
a second lens in the second optical axis between the beam splitter and the second camera;
so that a first magnification of the specimen at the first camera is obtained where the working distance of the objective lens from a specimen is equal to F0, and a second magnification of the specimen at the second camera is obtained where the working distance of the objective lens from the specimen is greater than 2F0.

8. The multiple magnification optical system of claim 7, where the principal plane is the rear principal plane of the objective lens, where the objective lens has front and rear principal planes.

9. The multiple magnification system of claim 7, further comprising:
a first frame;
the first frame holding the beam splitter, the first lens, the first camera, the second lens and the second camera in optical alignment with the gradient-index lens;
a sleeve; and,
the sleeve covering the length of the gradient-index lens;
the sleeve connected to the first frame;
the sleeve having a diameter adapted to be gripped by a nanomanipulator system.

10. The multiple magnification system of claim 7, further comprising: a second frame; the second frame holding the objective lens;
the second frame connected to the sleeve for the gradient-index lens, so that the gradient-index lens is held in optical alignment with the objective lens.

11. The multiple magnification system of claim 10, further comprising:
one or more fiber optics for transmitting light to illuminate the specimen;
the one or more fiber optics held by the second frame.

12. The multiple magnification system of claim 7, where the beam splitter is a dichroic mirror.

* * * * *